United States Patent
Georgakos et al.

[11] Patent Number: 5,946,249
[45] Date of Patent: Aug. 31, 1999

[54] CIRCUIT CONFIGURATION FOR A PROGRAMMABLE NONVOLATILE MEMORY AND METHOD FOR OPERATING THE CIRCUIT CONFIGURATION

[75] Inventors: Georg Georgakos, Fraunberg; Thomas Kern, Neubiberg; Diether Sommer; Thomas Zettler, both of München, all of Germany

[73] Assignee: Siemens Aktiengesellschaft, Munich, Germany

[21] Appl. No.: 09/145,212

[22] Filed: Aug. 31, 1998

Related U.S. Application Data

[63] Continuation of application No. PCT/DE97/00349, Feb. 27, 1997.

[51] Int. Cl.[6] .................................................. G11C 13/00
[52] U.S. Cl. .................. 365/201; 365/185.09; 365/200; 365/185.22; 371/21.1
[58] Field of Search .............................. 365/201, 189.01, 365/185.09, 200, 785.22; 371/10.1, 10.2, 21.1

[56] References Cited

U.S. PATENT DOCUMENTS

| | | | |
|---|---|---|---|
| 5,416,741 | 5/1995 | Ohsawa | 365/201 |
| 5,548,596 | 8/1996 | Tobita | 371/21.2 |
| 5,581,510 | 12/1996 | Furusho et al. | 365/201 |
| 5,610,861 | 3/1997 | Sim | 365/201 |
| 5,784,323 | 7/1998 | Adams et al. | 365/201 |
| 5,809,225 | 9/1998 | Ohsawa et al. | 395/183.08 |

FOREIGN PATENT DOCUMENTS

| | | |
|---|---|---|
| 0186040A1 | 7/1986 | European Pat. Off. . |
| 0186051A2 | 7/1986 | European Pat. Off. . |
| 0251889A1 | 1/1988 | European Pat. Off. . |
| 3002017B1 | 4/1981 | Germany . |
| 3249671C2 | 3/1988 | Germany . |
| 4207934A1 | 10/1992 | Germany . |

OTHER PUBLICATIONS

Japanese Patent Abstract No. 61165898 (Shinichi), dated Jul. 26, 1986.
Japanese Patent Abstract No. 63153797 (Koichi), dated Jun. 27, 1988.

*Primary Examiner*—Viet Q. Nguyen
*Attorney, Agent, or Firm*—Herbert L. Lerner; Laurence A. Greenberg

[57] ABSTRACT

A circuit configuration for a programmable nonvolatile memory having memory cells organized in rows and columns, includes a programming circuit which contains a first device for testing purposes that applies a programming current to a first predetermined number of memory cells in parallel for a first predetermined time period. During a second predetermined time period, the device thereupon connects a second predetermined number, which is greater than the first number, in parallel an applies the programming current to them. A method is provided for operating the circuit configuration.

10 Claims, 2 Drawing Sheets

CIRCUIT CONFIGURATION FOR A PROGRAMMABLE NONVOLATILE MEMORY AND METHOD FOR OPERATING THE CIRCUIT CONFIGURATION

CROSS-REFERENCE TO RELATED APPLICATION

This application is a continuation of copending International Application No. PCT/DE97/00349, filed Feb. 27, 1997, which designated the United States.

BACKGROUND OF THE INVENTION

1. FIELD OF THE INVENTION

The invention relates to a circuit configuration for a programmable nonvolatile memory, having a multiplicity of memory cells organized in rows and columns and having a programming circuit, wherein in order to test the memory cells of the memory, the programming circuit contains a test device which applies a programming current in each case to a first predetermined number of memory cells in parallel for a respective first predetermined time period until a first partial programming current of the programming current has been applied to each of the memory cells.

Nonvolatile memories, in particular one time programmable memory circuits (OTP=one time programmable memory), are increasingly being used in integrated microcontroller circuits and the like. Such a memory differs from a customary EPROM only due to the fact that a housing without any windows is used in the course of final assembly, as a result of which it is not possible to erase the memory content through the use of UV light, and consequently the memory can be written to only a single time.

Testing of such a memory therefore takes place prior to final assembly, e.g. while still on the wafer.

However, as the capacity of the memory increases, testing of each memory cell becomes time-consuming since approximately 50 μs are required to write to a memory cell. If the memory has a capacity of e.g. 1 megabit, then a time period of approximately 50 sec per I/O word width would be necessary just to write to each memory cell. Known memories therefore have an additional circuit configuration which allows a plurality of memory cells to be written to in parallel in the test mode. Such memories are disclosed, for example, in Published European Patent Application 0 186 040 A1, corresponding to U.S. Pat. No. 4,742,490 or Published European Patent Application 0 186 051 A2, corresponding to U.S. Pat. No. 4,742,489.

Since the programming current is relatively high as compared with the normal supply current for the component, only a limited number of memory cells can be written to simultaneously. That is because the lines only allow a specific maximum programming current without the module being damaged.

2. SUMMARY OF THE INVENTION

It is accordingly an object of the invention to provide a circuit configuration for a programmable nonvolatile memory and a method for operating the circuit configuration, which overcome the hereinafore-mentioned disadvantages of the heretofore-known devices and methods of this general type and which allow a test time of such a memory to be shortened.

With the foregoing and other objects in view there is provided, in accordance with the invention, a circuit configuration for a programmable nonvolatile memory, comprising a multiplicity of memory cells organized in rows and columns; and a programming circuit having a test device for testing the memory cells of the memory; the test device applying a programming current to each of a first predetermined number of the memory cells in parallel for a respective first predetermined time period until a first partial programming current of the programming current has been applied to each of the memory cells; and after the first partial programming current has been applied to the memory cells, the test device applying the programming current to each of a second predetermined number of the memory cells greater than the first number for a second predetermined time period until a second partial programming current of the programming current has been applied to each of the memory cells.

In accordance with another feature of the invention, the test device checks if each of the memory cells has been written to, after the second partial programming current has been applied to the memory cells.

In accordance with a further feature of the invention, the test device checks if each of the memory cells has been written to, after the first partial programming current has been applied to the memory cells.

In accordance with an added feature of the invention, there is provided a comparator circuit for checking a value of a voltage across the memory cell to be checked.

In accordance with an additional feature of the invention, the test device connects a multiplicity of columns in parallel and addresses the respective multiplicity of memory cells in parallel by selection of a row.

With the objects of the invention in view there is also provided a method for operating a circuit configuration for a programmable nonvolatile memory.

The invention exploits the fact that to program a memory cell of such a memory, a high programming current is required only for a relatively short time, which is then followed by a relatively long time phase during which a low programming current is required.

Therefore, during a first time period, the circuit according to the invention provides for a maximum permissible number of memory cells to be connected in parallel and to each have a first, relatively high programming current applied to them. This operation is repeated for the entire memory. During a second test section, a correspondingly larger number of memory cells are then connected in parallel and have the relatively low individual programming currents applied to them for the second time period. In this way, the time for a memory test can advantageously be shortened.

A further advantage can be effected by the two-stage test method in that an advance test of the memory cells can already be performed after the first energization of the memory cells, since the intermediate check from the voltage values of the memory cells that have been programmed up to that point already permits a first evaluation of the memory.

Other features which are considered as characteristic for the invention are set forth in the appended claims.

Although the invention is illustrated and described herein as embodied in a circuit configuration for a programmable nonvolatile memory and a method for operating the circuit configuration, it is nevertheless not intended to be limited to the details shown, since various modifications and structural changes may be made therein without departing from the spirit of the invention and within the scope and range of equivalents of the claims.

DESCRIPTION OF THE PREFERRED EMBODIMENTS

Figure 1:
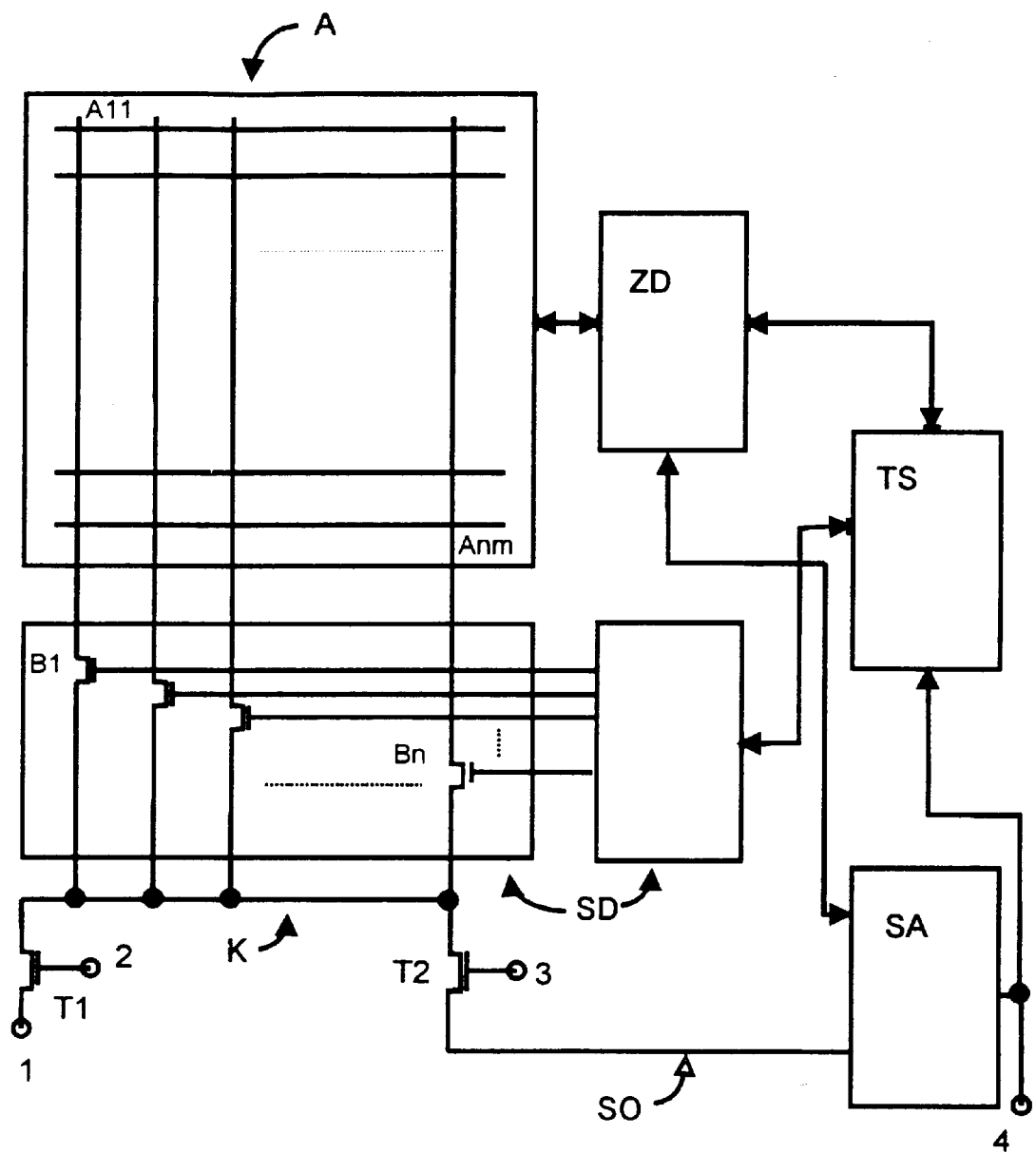
FIG. 1 is a simplified block diagram of a programmable nonvolatile memory having a circuit configuration according to the invention.

Referring now to the figures of the drawings in detail and first, particularly, to FIG. 1 thereof, it is seen that reference symbol A represents a block containing memory cells Anm which are disposed in m rows and n columns. A memory cell is to be disposed at each crossover point. Two memory cells, a cell A11 and the cell Anm, are indicated symbolically. Individual rows of this memory matrix are decoded by a row decoder ZD. The row decoder is in turn driven by a test circuit TS. A further decoder for selection of columns is designated by reference symbol SD. The further decoder SD contains, inter alia, n selection transistors B1 . . . Bn. The column decoder SD is also driven by the test circuit TS. The transistors B1 . . . Bn contained in the column decoder SD have load paths each connecting a respective column line to a common node line K. Elements TS, SD and ZD form a test device of the programming circuit.

The node line K is connected, on one hand, through a load path of a first control transistor T1 to a terminal 1. The transistor T1 has a gate connected to a control terminal 2.

Furthermore, the node line K is connected through a load path of a second transistor T2 to a column output line SO, which is in turn connected to a sense amplifier SA. An output signal at an output of the sense amplifier SA can be picked off at a terminal 4. The output signal of the sense amplifier SA is furthermore fed to the test circuit TS. A cell is programmed through the use of so-called "hot electrons" in a known manner. This method of programming memory cells with hot electrons is generally known as the CHE (Carrier Hot Electrons) method. In contrast to the FN (Fowler Nordheim) method, a comparatively large programming current is required in this case since the electron yield is comparatively low (<1%).

Figure 2:
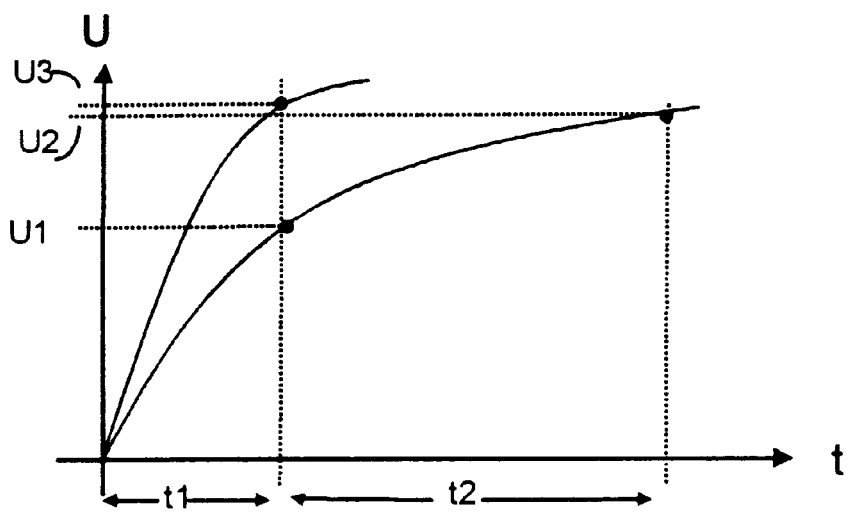
FIG. 2 is a graph showing a time characteristic of a voltage across a memory cell during programming.

In this respect, FIG. 2 shows a typical characteristic of a threshold voltage across a memory cell Anm to be programmed. If such a cell is programmed, then the threshold voltage increases to a relatively great extent during a first time period t1. For this purpose, a large programming current, which decreases with time, flows through the cell. During a subsequent, second time period t2, the memory cell then reaches its final threshold voltage value which is necessary for programming, through the use of a distinctly lower programming current.

The memory is then tested as follows: the actual programming current is applied to the terminal 1. This programming current is limited to a maximum value $I_{max}$ in a manner governed by the circuit. Accordingly, only a limited number of memory cells can be programmed simultaneously. This number is produced by dividing the total current $I_{max}$ by a necessary individual current $I_{nm}$ for a memory cell. Accordingly, e.g., q memory cells can be connected in parallel during the time period t1, where the following holds true:

$$q = \frac{I_{max}}{I_{nm}}.$$

The test circuit TS therefore connects the corresponding number q of columns in parallel through the column decoder SD. The memory cells which are respectively connected in parallel are then selected by the row decoder ZD and the programming voltage is applied to the node line K through the transistor T1, which is driven by a corresponding signal at the terminal 2. The programming current for the individual memory cells that are connected in parallel passes through the respective transistors Bn to the memory cells. This state is maintained for the time period t1. After the time period t1, intact memory cells then reach a voltage value U1. This procedure is subsequently carried out sequentially for all of the remaining memory cells of the entire memory, that is to say the number of passes p results from:

$$p = \frac{n \cdot m}{q}.$$

This first programming stage is followed by the second programming stage during the time period t2. A smaller programming current $I'_{nm}$ is necessary during this time period t2, as is evident in FIG. 2. Therefore, a larger number, namely $$q + x = \frac{I_{max}}{I'_{nm}},$$

can then be programmed. This second partial programming current $I'_{nm}$ is fed in the same way as the first partial programming current. After the time period t2, the voltage value of an intact memory cell reaches a voltage value U2.

It is then possible to determine whether or not all of the memory cells have reached this desired voltage value U2 in a concluding test run, by reading of the individual memory cell values with the test circuit TS in a customary manner.

A defective cell is distinguished not only by the fact that it does not reach the voltage value U1 during the first programming phase t1 but rather also by the fact that it exceeds this value U1 and reaches an increased voltage value U3 as early as after the time period t1. If such a memory cell is present, then it is known that although that cell is provisionally intact, such a memory cell will fail after a specific period of time.

A development of the circuit configuration according to the invention exploits this, by carrying out a first test cycle as early as after the time period t1. This is because even then it can be determined whether or not the memory contains such memory cells that will fail in the near future or are defective in some other way. This is the case when the value U1 is distinctly undershot or exceeded. Therefore, it is already possible to ascertain, in the event of an erroneous test result during this phase, that the memory is defective and to terminate the test or to activate corresponding redundancy circuits which replace the defective cells.

The measures according to the invention considerably shorten a test cycle for a programmable nonvolatile memory. The test circuit according to the invention can be used both in the case of normal memory circuits, such as EPROMs, for example, or, as mentioned in the introduction, in the case of programmable nonvolatile memories which are concomitantly integrated in microcontroller circuits.

We claim:

1. A circuit configuration for a programmable nonvolatile memory, comprising:

a multiplicity of memory cells organized in rows and columns; and a programming circuit having a test device for testing said memory cells;

said test device applying a programming current to each of a first predetermined number of said memory cells in parallel for a respective first predetermined time period until a first partial programming current of the programming current has been applied to each of said memory cells; and after the first partial programming current has been applied to said memory cells, said test device applying the programming current to each of a second predetermined number of said memory cells greater than said first number for a second predetermined time period until a second partial programming current of the programming current has been applied to each of said memory cells.

2. The circuit configuration according to claim 1, wherein said test device checks if each of said memory cells has been written to, after the second partial programming current has been applied to said memory cells.

3. The circuit configuration according to claim 1, wherein said test device checks if each of said memory cells has been written to, after the first partial programming current has been applied to said memory cells.

4. The circuit configuration according to claim 1, including a comparator circuit for checking a value of a voltage across said memory cell to be checked.

5. The circuit configuration according to claim 1, wherein said test device connects a multiplicity of columns in parallel and addresses said respective multiplicity of memory cells in parallel by selection of a row.

6. A method for operating a circuit configuration for a programmable nonvolatile memory, which comprises:

providing a multiplicity of memory cells organized in rows and columns;

providing a programming circuit having a test device for testing the memory cells;

applying a programming current with the test device to each of a first predetermined number of the memory cells in parallel for a respective first predetermined time period until a first partial programming current of the programming current has been applied to each of the memory cells; and after the first partial programming current has been applied to the memory cells, applying the programming current with the test device to each of a second predetermined number of the memory cells greater than the first number for a second predetermined time period until a second partial programming current of the programming current has been applied to each of the memory cells.

7. The method according to claim 1, which comprises checking with the test device if each of the memory cells has been written to, after the second partial programming current has been applied to the memory cells.

8. The method according to claim 1, which comprises checking with the test device if each of the memory cells has been written to, after the first partial programming current has been applied to the memory cells.

9. The method according to claim 1, which comprises checking a value of a voltage across the memory cell to be checked, with a comparator circuit.

10. The method according to claim 1, which comprises connecting a multiplicity of columns in parallel and addressing the respective multiplicity of memory cells in parallel by selection of a row, with the test device.

* * * * *

UNITED STATES PATENT AND TRADEMARK OFFICE
CERTIFICATE OF CORRECTION

PATENT NO. : 5,946,249
DATED : August 31, 1999
INVENTOR(S) : Georg Georgakos et al.

It is certified that error appears in the above-identified patent and that said Letters Patent is hereby corrected as shown below:

On the title page,

Item [30] should read as follows:

Feb. 29, 1996     [DE]    Germany .......... 196 07 724.9

Signed and Sealed this

Ninth Day of January, 2001

*Attest:*

Q. TODD DICKINSON

*Attesting Officer*      *Commissioner of Patents and Trademarks*